(12) United States Patent
Tautges et al.

(10) Patent No.: US 7,050,951 B1
(45) Date of Patent: May 23, 2006

(54) AUTOMATIC DETECTION OF SWEEP-MESHABLE VOLUMES

(75) Inventors: Timothy J. Tautges, Madison, WI (US); David R. White, Pittsburgh, PA (US)

(73) Assignee: Sandia Corporation, Albuquerque, NM (US)

( * ) Notice: Subject to any disclaimer, the term of this patent is extended or adjusted under 35 U.S.C. 154(b) by 786 days.

(21) Appl. No.: 09/927,691

(22) Filed: Aug. 8, 2001

Related U.S. Application Data

(60) Provisional application No. 60/226,445, filed on Aug. 17, 2000.

(51) Int. Cl.
*G06F 17/50* (2006.01)

(52) U.S. Cl. ............................. 703/2; 716/20; 345/419; 345/423

(58) Field of Classification Search ................ 703/2, 703/5, 7; 345/419, 423, 428, 429, 490, 426; 716/20
See application file for complete search history.

(56) References Cited

U.S. PATENT DOCUMENTS

| | | | |
|---|---|---|---|
| 5,768,156 A * | 6/1998 | Tautges et al. ................ 716/20 |
| 6,084,593 A * | 7/2000 | Gibson ......................... 345/426 |
| 6,307,551 B1 * | 10/2001 | Gueziec et al. ............. 345/419 |
| 6,825,839 B1 * | 11/2004 | Huang et al. ................ 345/423 |

OTHER PUBLICATIONS

White et al., "Automatic Scheme Selection for Toolkit Hex Meshing," International Journal for Numerical Methods in Engineering, vol. 49, Jul. 18, 2000, 127-144.

Blacker, Ted, *The Cooper Tool*, Aug. 27, 1996, pp. 1-17, Fluid Dynamics International, Evanston, IL.

Cass, Roger J., et al., "Generalizaed 3-D Paving: An Automated Quadrilateral Surface Mesh Generation Algorithm", *International Journal for Numerical Methods in Engineering*, 1996, pp. 1475-1489, John Wiley & Sons, Ltd.

Folwell, Nathan T., et al., *Reliable Whisker Weaving vis Curve Contraction*, Oct., 1998, Proc. 7th Int. Meshing Roundtable, Sandia National Laboratories, Albuquerque, New Mexico.

Gilkey, Amy P., et al., *GEN3D: A GENESIS Database 2D to 3D Transformation Program*, Feb., 1994, Sandia National Laboratories, Albuquerque, New Mexico.

Knupp, Patrick M., "Applications of Mesh Smoothing: Copy, Morph, and Sweep on Unstructured Quadrilateral Meshes", *International Journal for Numerical Methods in Engineering*, 1999, pp. 37-45, vol. 45, John Wiley & Sons, Ltd.

(Continued)

*Primary Examiner*—Thai Phan
(74) *Attorney, Agent, or Firm*—Madelynne Farber

(57) ABSTRACT

A method of and software for automatically determining whether a mesh can be generated by sweeping for a representation of a geometric solid comprising: classifying surface mesh schemes for surfaces of the representation locally using surface vertex types; grouping mappable and submappable surfaces of the representation into chains; computing volume edge types for the representation; recursively traversing surfaces of the representation and grouping the surfaces into source, target, and linking surface lists; and checking traversal direction when traversing onto linking surfaces.

22 Claims, 14 Drawing Sheets

Volume whose sweep scheme and source/target surfaces were determined automatically.

OTHER PUBLICATIONS

Lai, Mingwu, et al., *Automated Hexahedral Mesh Generation By Generalized Multiple Source to Multiple Target Sweeping*, Aug., 1999, 2nd Symposium on Trends in Unstructured Mesh Generation, Boulder, Colorado.

Liu, S.-S., et al., "A dual geometry—topology constraint approach for determination of pseudo-swept shapes as applied to hexahedral mesh generation", *Computer-Aided Design*, 1999, pp. 413-426, vol. 31, Elsevier Science Ltd.

Lu, Yong, et al., "Feature Based Volume Decomposition for Automatic Hexahedral Mesh Generation", *1999 ASME Design Automation Conference*, Sep., 1999, pp. 1-36.

Migwu, Lai, et al., *A Multiple Source and Target Sweeping Method for Generating All Hexahedral Finite Element Meshes*, Sep., 1996, Proc. 5th Int. Meshing Roundtable, SAND96-2301, Sandia National Laboratories, Albuquerque, New Mexico.

Mitchell, Scott A., *A Characterization of the Quadrilateral Meshes of a Surface Which Admit a Compatible Hexahedral Mesh of the Enclosed Volume*, 1996, pp. 465-476, Proceedings of the 13th Annual Symposium on Theoretical Aspects of Computer Science, Springer.

Muller-Hannemann, Matthias, *Hexahedral Mesh Generation by Successive Dual Cycle Elimination*, Oct., 1998, Proc. 7th Int. Meshing Roundtable, Sandia National Laboratories, Albuquerque, New Mexico.

Razdan, Anshuman, et al., "Feature Based Object Decomposition for Finite Element Meshing", *The Visual Computer*, 1989, pp. 291-303, vol. 5.

Sheffer, Alla, et al., *Hexahedral Mesh Generation using the Embedded Voronoi Graph*, Oct., 1998, Proc. 7th Int. Meshing Roundtable, Sandia National Laboratories, Albuquerque, New Mexico.

Shepherd, Jason, et al., *Interval Assignment for Volumes with Holes*, Aug., 1999, 2nd Symposium on Trends in Unstructured Mesh Generation, Boulder, Colorado.

Staten, M.L., et al., *BMSweep: Locating Interior Nodes During Sweeping*, Oct., 1998, Proc. 7th Int. Meshing Roundtable, Sandia National Laboratories, Albuquerque, New Mexico.

Stephenson, M.B., et al., "Using Conjoint Meshing Primitives to Generate Quadrilateral and Hexahedral Elements in Irregular Regions", *Computers in Engineering*, (Eds. D.R. Riley, et al.), 1989, pp. 163-172, The American Society of Mechanical Engineers.

Subrahmanyam, Somashekar, et al., "An Overview of Automatic Feature Recognition Techniques for Computer-Aided Process Planning", *Computers in Industry*, 1995, pp. 1-21, vol. 26.

White, David R., et al., *Automated Hexahedral Mesh Generation by Virtual Decomposition*, Sep., 1995, Proc. 4th Int. Meshing Roundtable, SAND95-2130, Sandia National Laboratories, Albuquerque, New Mexico.

* cited by examiner

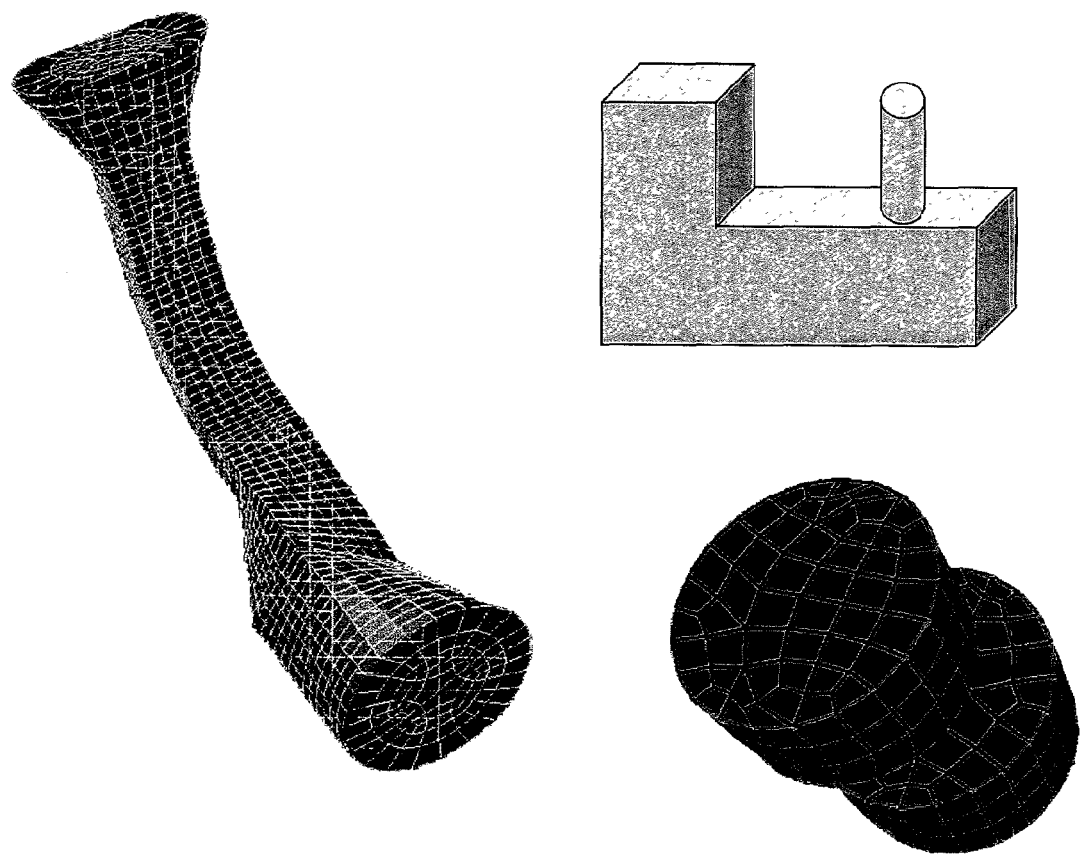
Figure 1: Sweepable geometries.

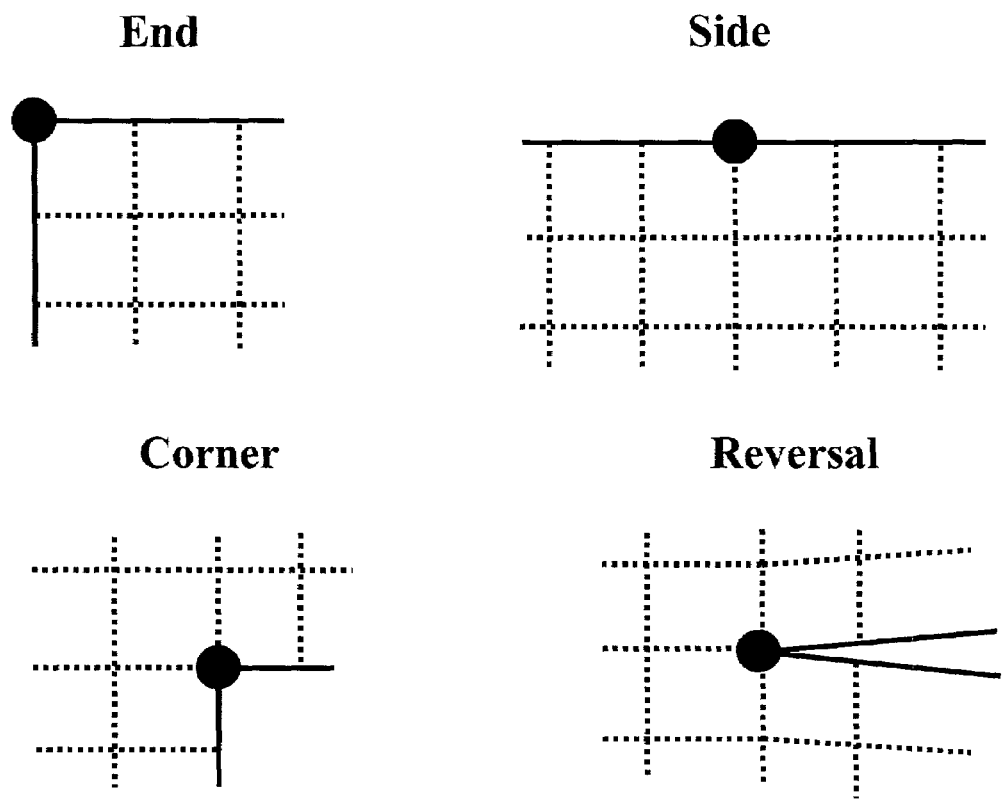
Figure 2: Mesh topology in neighborhood of surface vertex types; geometry (vertices and edges) are represented by solid points and lines, mesh edges represented by dashed lines.

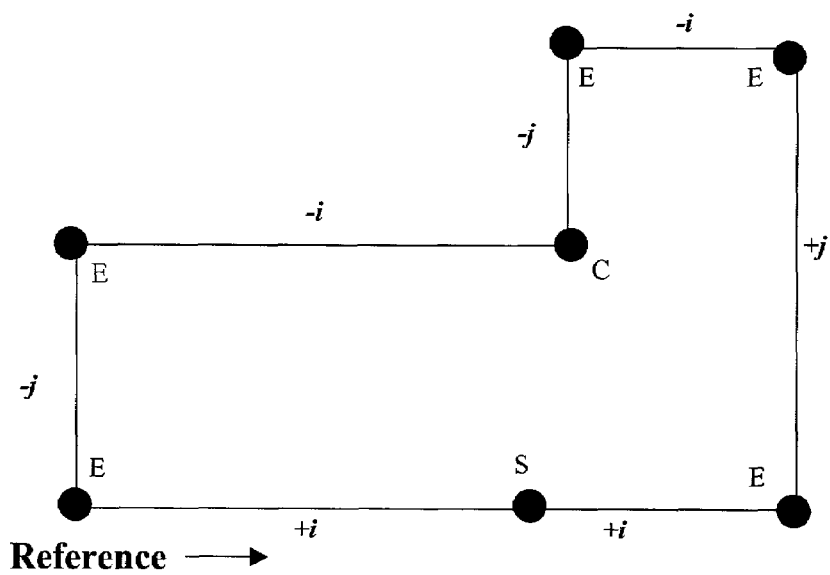
Figure 3: Submappable surface, showing vertex types (E=end, C=corner, S=side) and parametric directions (+/- $i$, +/- $j$).

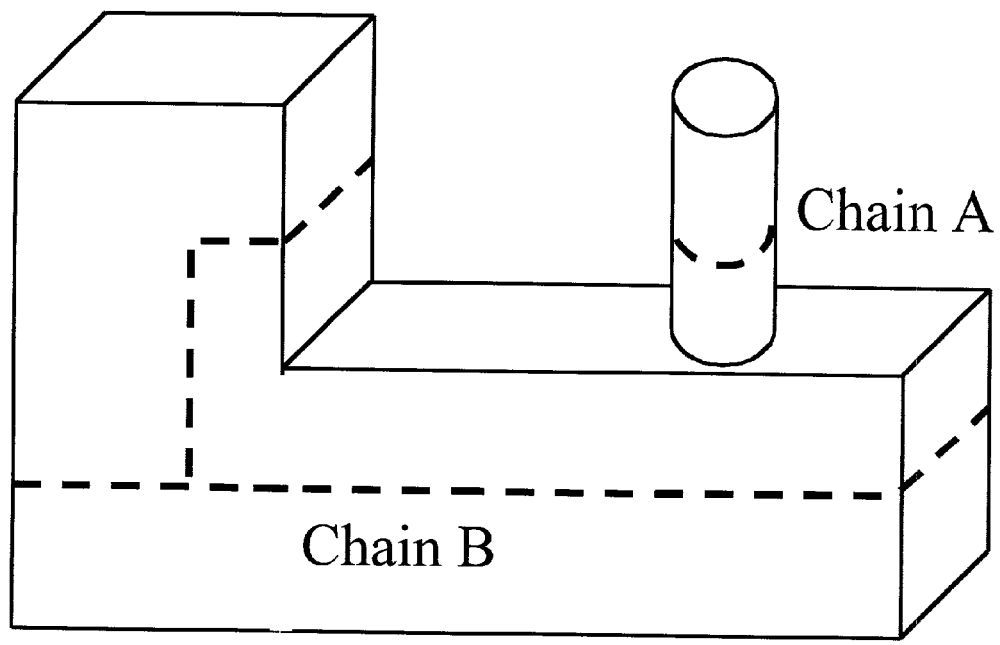
Figure 4: Chains on a solid; Chain A is on a periodic surface ; Chain B is branched.

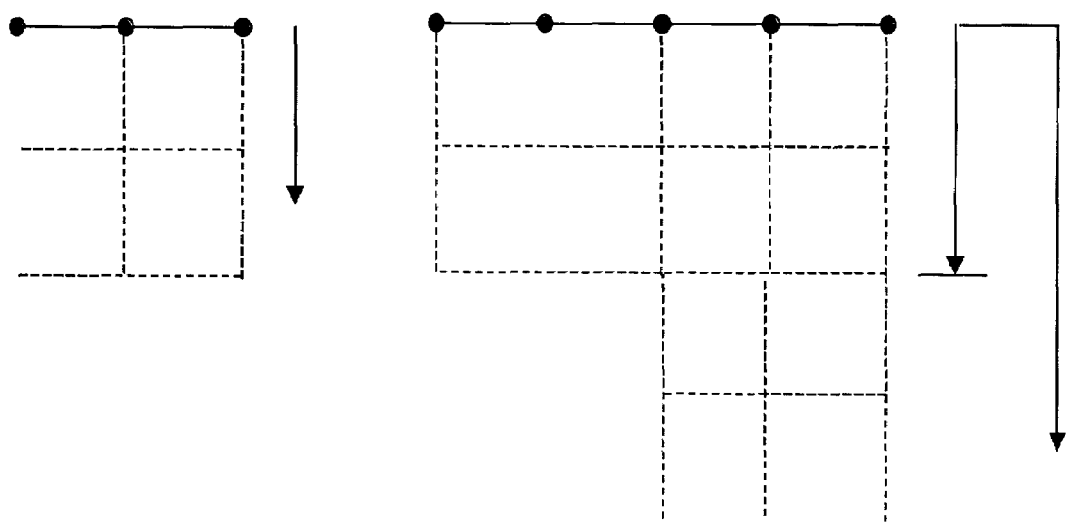
Figure 5: Extrusion of a facetted line into a mapped mesh (left); extrusion of different parts different distances into a submapped mesh (right).

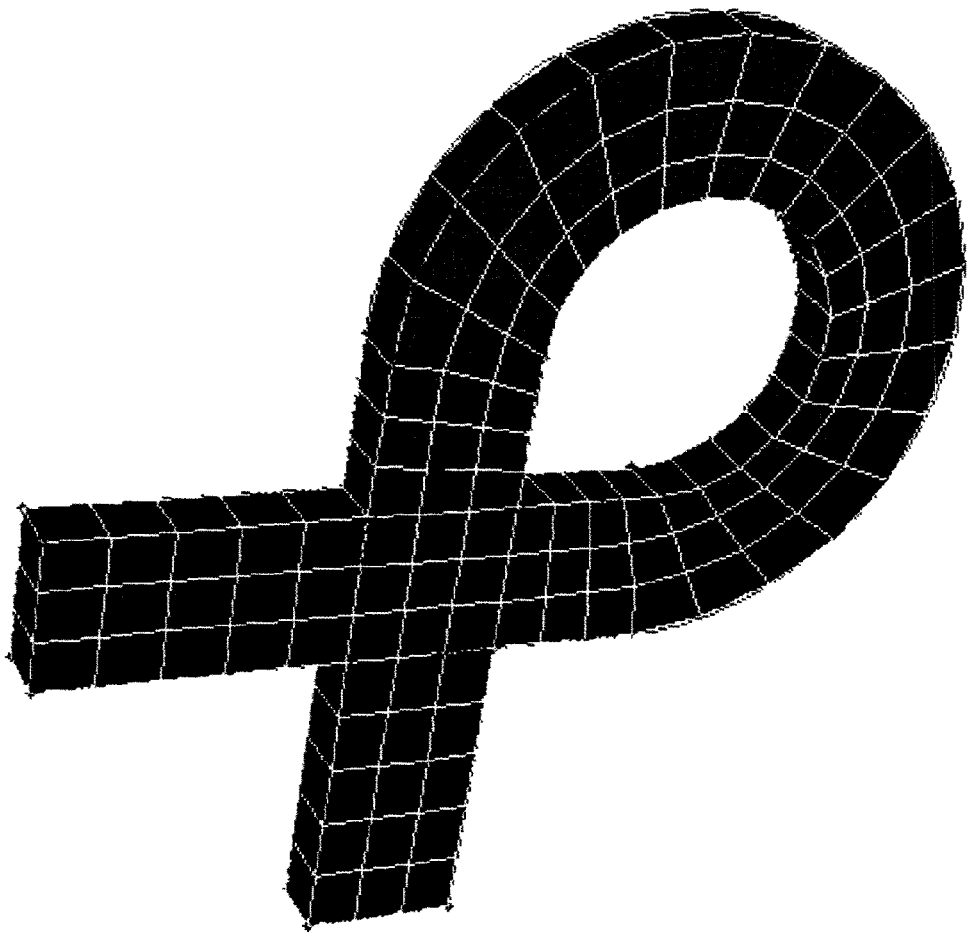
Figure 6: Volume that appears sweepable but which is not a true extrusion.

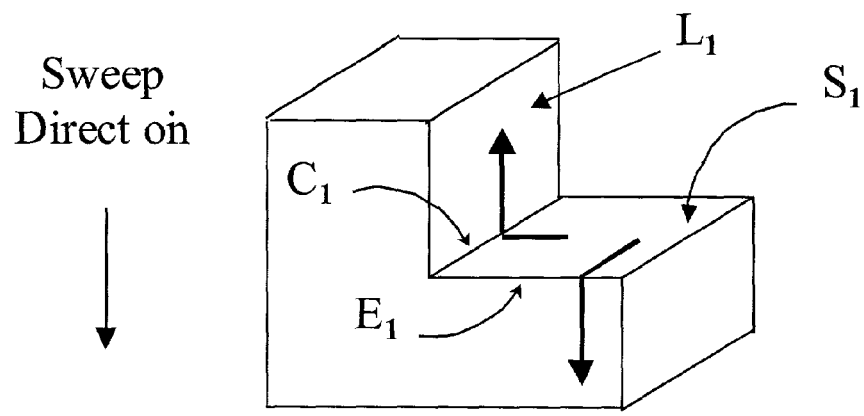
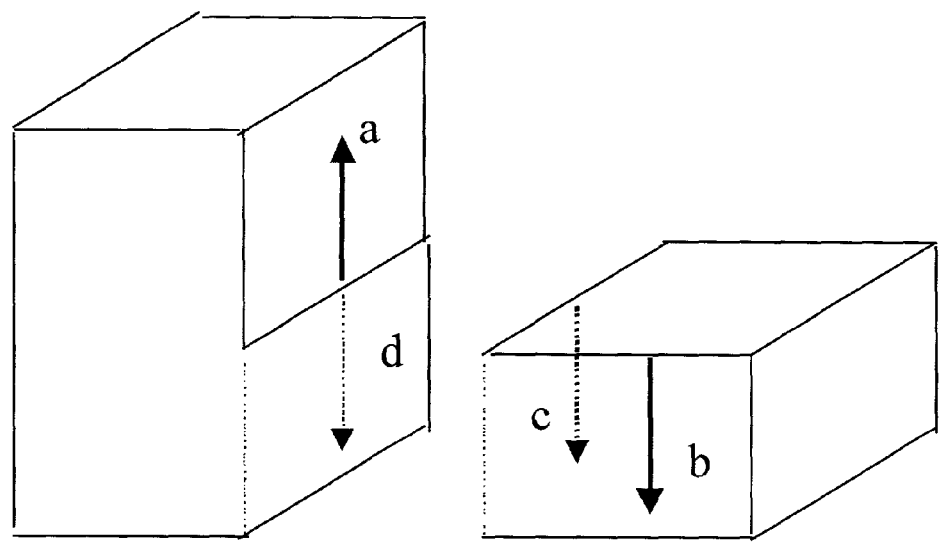
Figure 7: Traversing from a source surface over a Corner-type edge (C1) and End-type edge (E1) results in traversing the linking surface in opposite directions along the same ij parameter.

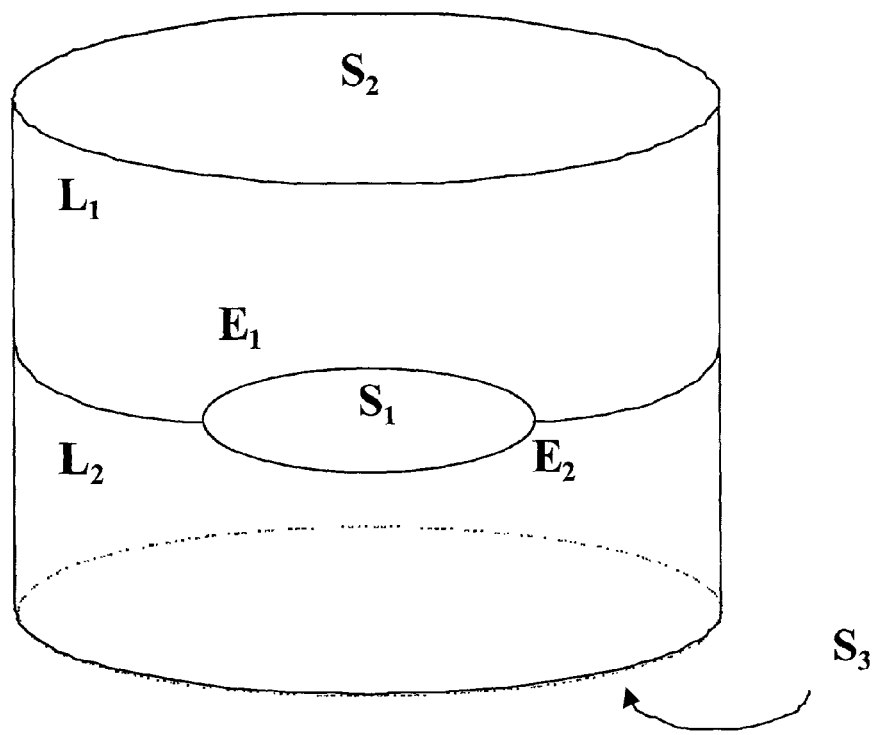
Figure 8: An example of Theorem 1b and 1c showing sweepability of a volume. When edges $E_1$ and $E_2$ are set to type End, the volume is not sweepable; the volume becomes sweepable if $E_1$ or $E_2$ is set to type corner.

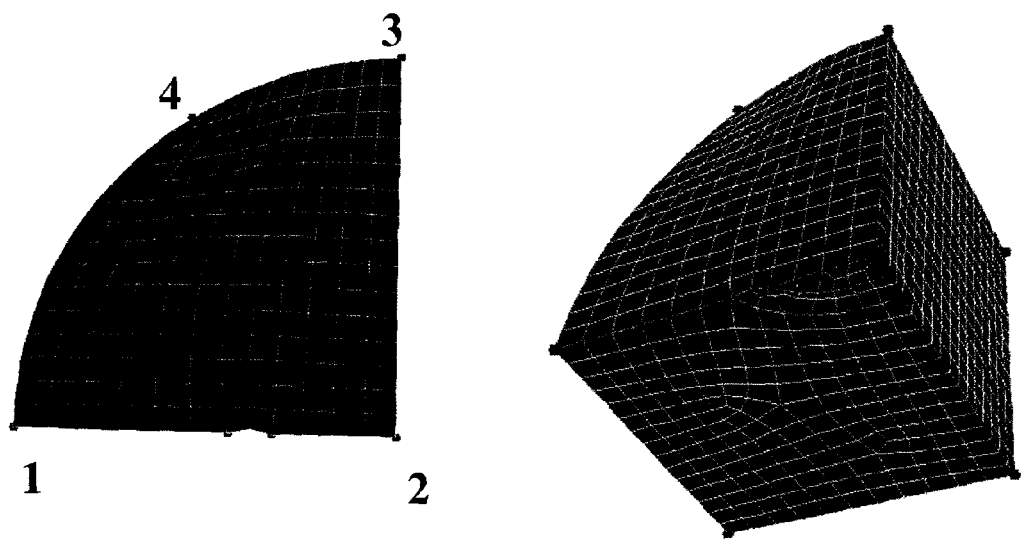
Figure 9: Vertex type adjustment for vertex 4 makes surface mappable (left); making surface mappable allows volume to be swept (right).

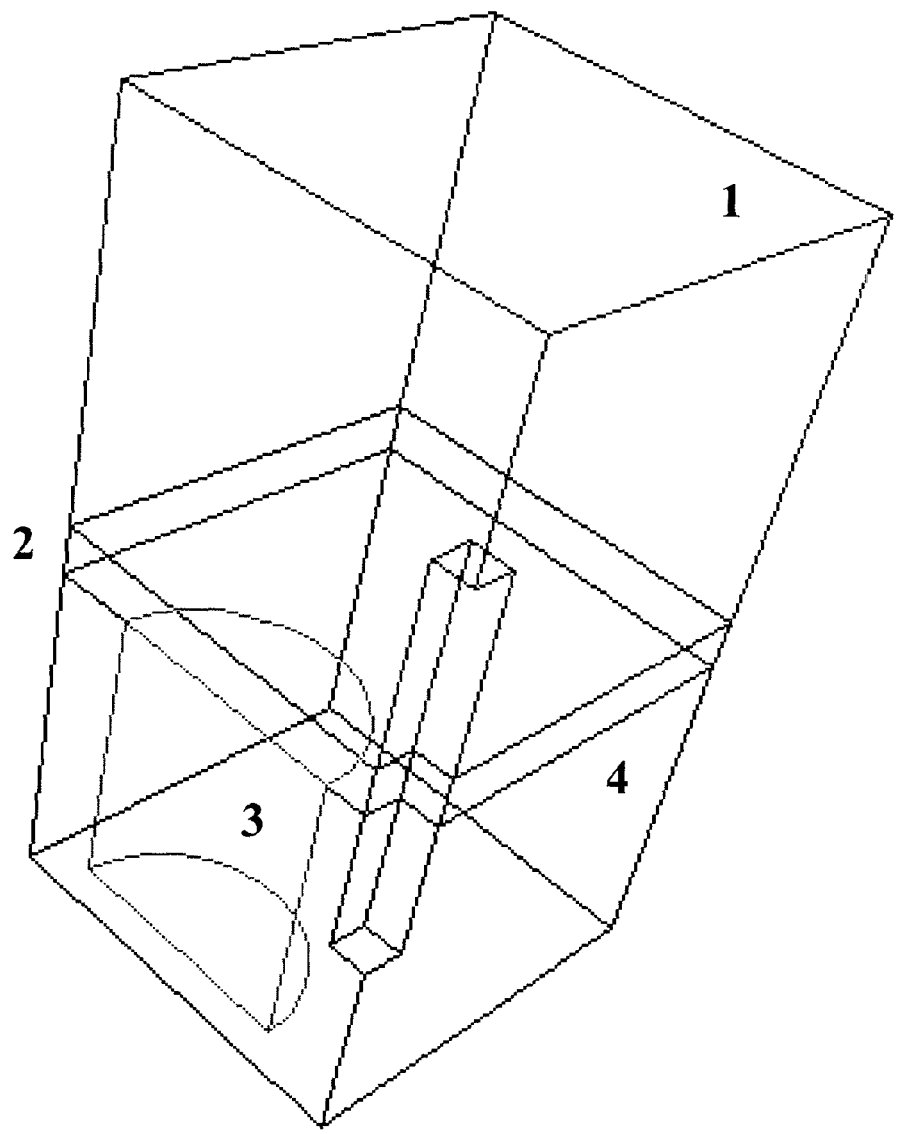
Figure 10: Four volumes demonstrating sweep order dependencies.

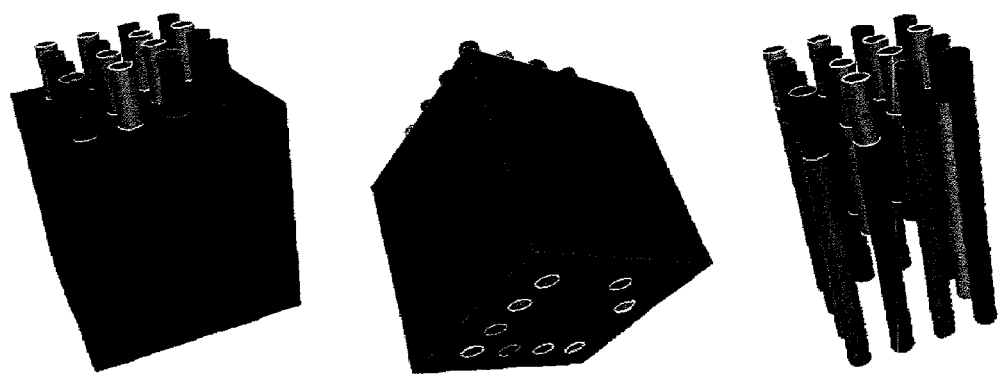
Figure 11: Collection of volumes whose schemes, source and target surfaces were detected automatically. Note inner core of rods which produces blind holes in block.

Figure 12: Volume whose sweep scheme and source and target surfaces were determined automatically.

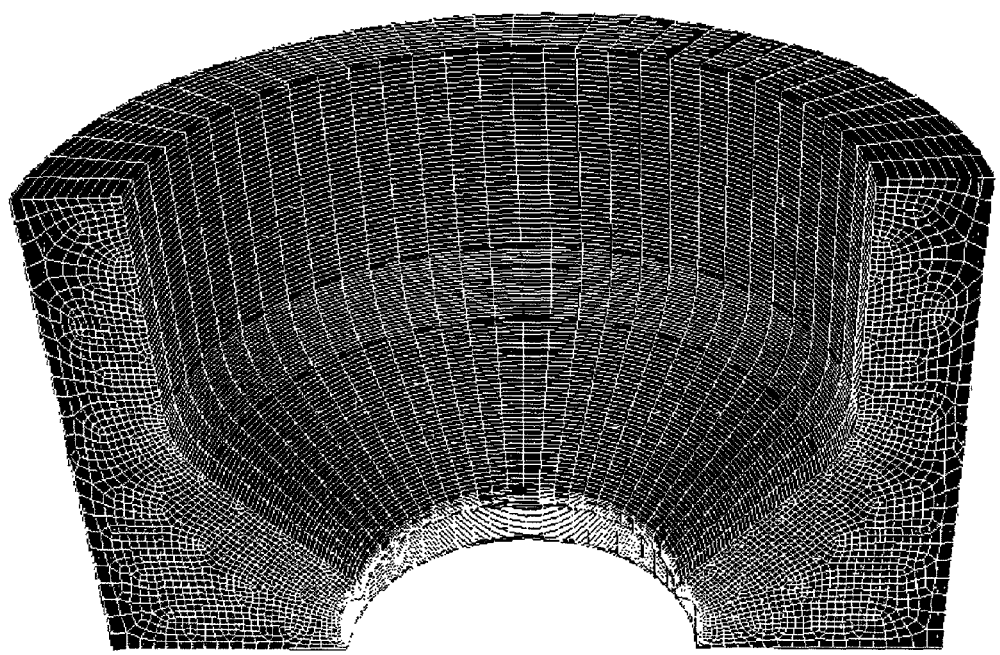
Figure 13: Volume whose sweep scheme and source/target surfaces were determined automatically.

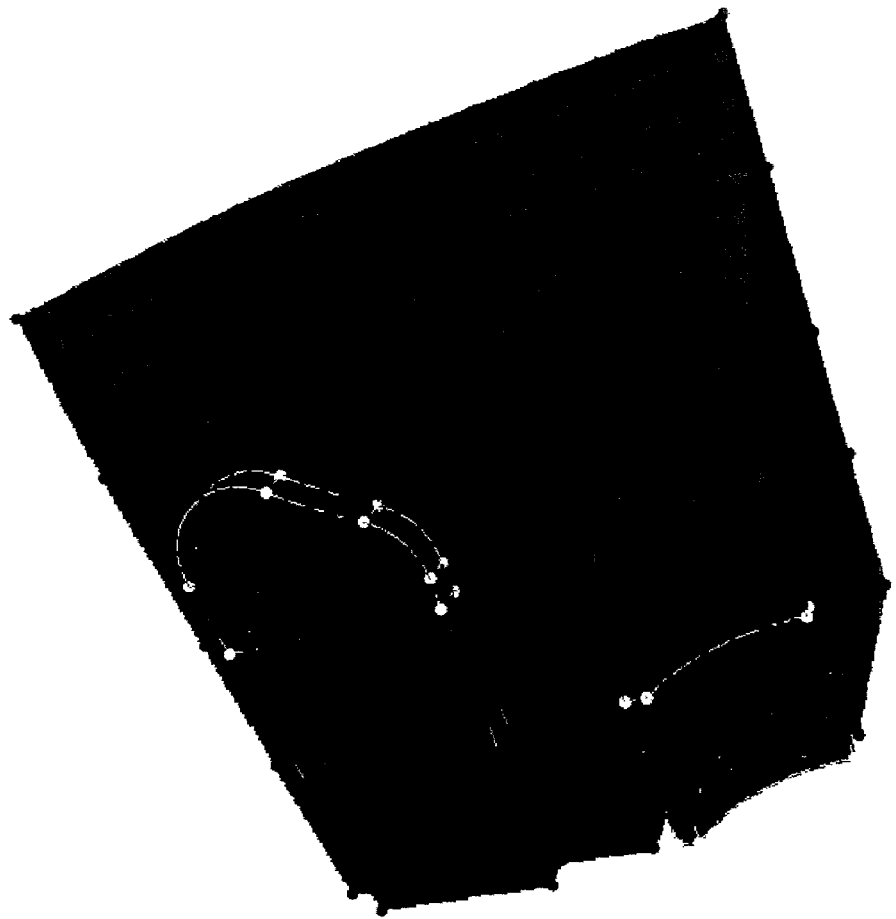
Figure 14: Group of volumes whose sweep schemes and source and target surfaces were determined automatically.

AUTOMATIC DETECTION OF SWEEP-MESHABLE VOLUMES

This invention claims priority under 35 U.S.C. § 119(e) to U.S. Provisional Patent Application Serial No. 60/226,445, filed Aug. 17, 2000.

GOVERNMENT RIGHTS

The Government has rights to this invention pursuant to Contract No. DE-AC04-94AL85000 awarded by the U.S. Department of Energy.

BACKGROUND OF THE INVENTION

1. Field of the Invention (Technical Field)

The present invention relates to hexahedral mesh generation techniques.

2. Background Art

The finite element method is used to simulate a wide variety of physical phenomena, for example heat transfer, structural mechanics, and computational fluid dynamics. In recent years, mesh generation has emerged as one of the major bottlenecks in the simulation process. Although a high degree of automation is available in tetrahedral mesh generators, hexahedral mesh generators still require a great deal of user intervention. Since it is widely believed that hexahedral meshes are more accurate and more robust for some types of finite element analysis, especially in the non-linear regime, these types of meshes are more commonly used.

There has been a great deal of research into automated, all-hexahedral meshing algorithms, e.g., N. T. Folwell, et al., "Reliable Whisker Weaving via Curve Contraction", Proc. 7th Int. Meshing Roundtable, Sandia National Laboratories, Albuquerque, N. Mex. (October 1998); A. Scheffer, et al., "Hexahedral Mesh Generation Using the Embedded Voronoi Skeletons", Proc. 7th Int. Meshing Roundtable, Sandia National Laboratories, Albuquerque, N. Mex. (October 1998); and M. Muller-Hannemann, "Hexahedral Mesh Generation by Successive Dual Cycle Elimination", Proc. 7th Int. Meshing Roundtable, Sandia National Laboratories, Albuquerque, N. Mex. (October 1998), but as yet no algorithm has been found with the key characteristics of high robustness, high mesh quality and low element count. Therefore, current hexahedral mesh generation techniques rely on a set of simpler tools, which when combined with geometry decomposition leads to an adequate mesh generation process. The meshing algorithms in these tools include mapping/submapping, David R. White, "Automated Hexahedral Mesh Generation by Virtual Decomposition", Proc. 4th Int. Meshing Roundtable, SAND95-2130, Sandia National Laboratories, Albuquerque, N. Mex. (September 1995), primitive templates, M. B. Stephenson, et al., "Using Cojoint Meshing Primitives to Generate Quadrilateral and Herxahedral Elements in Irregular Regions", Proc. ASME Computations in Engineering Conference (1989), and sweeping or extrusion, Patrick M. Knupp, "Applications of Mesh Smoothing: Copy, Morph, and Sweep on Unstructured Quadrilateral Meshes", *Int. J. Numer. Meth. Eng.*, 45, 37–45 (1999). Of these, sweeping tends to be the workhorse algorithm, usually accounting for at least 50% of most meshing applications.

The sweeping algorithm involves extruding a set of quadrilaterals into a third dimension, producing a hexahedral mesh. The cross-section of the geometry being meshed can vary along the sweep direction, and the number of quadrilaterals in the set being swept can vary as well. FIG. 1 shows several sweepable geometries. Many of the commercial mesh generation software packages currently include some form of sweeping algorithm, e.g., Enterprise Software Products'FEMAP and ANSYS, Inc.'s ANSYS, and varieties of this algorithm are reported elsewhere in the literature, e.g., Patrick M. Knupp, supra; M. L. Staten, et al., "BMsweep: Locating Interior Nodes During Sweeping", Proc. 7th Int. Meshing Roundtable, Sandia National Laboratories, Albuquerque, N. Mex. (October 1998) and T. Blacker, "The Cooper Tool", Proc. 5th Int. Meshing Roundtable, SAND96-2301, Sandia National Laboratories, Albuquerque, N. Mex. (September 1996).

While sweeping is a widely used algorithm, it is not well automated. Before a volume can be "swept", the algorithm must be provided with input about which surface meshes are being swept along which side surfaces, and for how far. In practice, the process of determining and specifying these source/target surfaces is user-intensive and error prone. In order to increase the level of automation in all-hexahedral meshing, an automatic method for determining sweep directions and source/target surfaces is needed.

The detection of swept features has been studied in the feature recognition community for some time, e.g., S.-S. Liu, et al., "A dual geometry—topology constraint approach for determination of pseudo-swept shapes as applied to hexahedral mesh generation", *Computer-Aided Design* 31:413–426 (1999), Somashekar Subrahmanyam, et al., "An Overview of Automatic Feature Recognition Techniques for Computer-Aided Process Planning", Computers in Industry 26:1–21 (1995), and Anshuman Razdan, et al., "Feature Based Object Decomposition for Finite Element Meshing", The Visual Computer 5:291–303 (1989). However, the resulting algorithms are usually geometry-based, relying on arrangements such as parallel surfaces for detecting the features. These arrangements represent geometric constraints placed on extruded volumes that that are determined by the application, for example, solids to be manufactured by machining.

The present invention is of a method for detecting extruded or sweepable geometries. This method is based on topological and local geometric criteria, and is more robust than feature recognition-based algorithms. The present invention may also be used to detect extruded features for the purposes of feature extraction and disassembly planning.

SUMMARY OF THE INVENTION
(DISCLOSURE OF THE INVENTION)

The present invention is of a method of and software for automatically determining whether a mesh can be generated by sweeping for a representation of a geometric solid, comprising: classifying surface mesh schemes for surfaces of the representation locally using surface vertex types; grouping mappable and submappable surfaces of the representation into chains; computing volume edge types for the representation; recursively traversing surfaces of the representation and grouping the surfaces into source, target, and linking surface lists; and checking traversal direction when traversing onto linking surfaces. In the preferred embodiment, the invention additionally comprises determining that no mesh can be generated if a number of chains established in the grouping step is zero, determining that chains contain a consistent ij parameterization, determining that all source/target surfaces sharing edges have a same non-traversed parameter with respect to linking surfaces bounding them, and determining that all linking surfaces have a globally consistent ij parameterization (preferably via determining that traversing from a source/target surface over any two edges of a same edge type onto one or more linking surface results in traversing a non-traversed parameter in a same direction and determining that traversing from a source/target surface over any two edges of a different edge type onto one or more linking surfaces results in traversing a non-traversed parameter in an opposite direction). The volume edge types preferably comprise end, side, corner, and reversal, and are not computed until it is verified that chains are complete. A determination is made that no mesh can be generated if in traversing a surface is encountered which should be submappable and part of a chain but is not.

The present invention is additionally of a method of and software for automatically determining an order in which to mesh surfaces of a meshable representation of a geometric solid, comprising: performing the invention according to the preceding paragraph and recursively traversing the source and target lists.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings:

FIG. 1 illustrates three sweepable geometries;

FIG. 2 illustrates mesh topology in neighborhood of surface vertex types; geometry (vertices and edges) are represented by solid points and lines, mesh edges represented by dashed lines;

FIG. 3 illustrates a submappable surface, showing vertex types (E=end, C=corner, S=side) and parametric directions (+/−i, +/−j);

FIG. 4 illustrates chains on a solid; Chain A is on a periodic surface; Chain B is branched;

FIG. 5 illustrates extrusion of a faceted line into a mapped mesh (left) and extrusion of different parts different distances into a submapped mesh (right);

FIG. 6 illustrates a volume that appears to be sweepable but which is not a true extrusion;

FIG. 7 illustrates that traversing from a source surface over a Corner-type edge (C1) and End-type edge (E1) results in traversing the linking surface in opposite directions along the same ij parameter;

FIG. 8 is an example of Theorem 1b and 1c showing sweepability of a volume; when edges $E_1$ and $E_2$ are set to type End, the volume is not sweepable; the volume becomes sweepable if $E_1$ or $E_2$ is set to type Corner;

FIG. 9 illustrates that a vertex type adjustment for vertex 4 makes the surface mappable (left) and that making the surface mappable allows the volume to be swept (right);

FIG. 10 illustrates four volumes demonstrating sweep order dependencies;

FIG. 11 is a collection of volumes whose schemes, source, and target surfaces are detected automatically by the invention; note the inner core of rods which produces blind holes in the block;

FIG. 12 illustrates a volume whose sweep scheme and source and target surfaces are automatically determined by the invention;

FIG. 13 illustrates another volume whose sweep scheme and source and target surfaces are automatically determined by the invention; and FIG. 14 is a group of volumes whose sweep schemes and source and target surfaces are determined automatically by the invention.

DESCRIPTION OF THE PREFERRED EMBODIMENTS (BEST MODES FOR CARRYING OUT THE INVENTION)

The present invention is of a method for detecting extruded or sweepable geometries. The method uses topological and local geometric information, and is more robust than feature recognition-based algorithms. A method for computing sweep dependencies in volume assemblies is also given. The auto sweep detect and sweep grouping methods have been used to reduce interactive user time required to generate all-hexahedral meshes by filtering out non-sweepable volumes needing further decomposition and by allowing concurrent meshing of independent sweep groups. Parts of the auto sweep detect method may also be used to identify independent sweep paths, for use in volume-based interval assignment. An embodiment of the invention has been implemented in the CUBIT mesh generation toolkit, T. D. Blacker, et al., "CUBIT mesh generation environment, Vol. 1: User's manual", SAND94-1100, Sandia National Laboratories, Albuquerque, N. Mex. (May 1994), and works for most sweepable geometries.

One begins with a geometric solid defined by a BREP or boundary representation model, for example as described in Mortensen, Michael E. Mortensen, 'Geometric Modeling', Wiley & Sons (1985). One further constrains this solid such that no surface contains a bounding vertex twice without also containing a connected bounding edge twice (by containing an entity twice, it is meant that entity occurs on the bounding loop(s) of edges twice). Also assume that all bounding surfaces are oriented with respect to the volume under consideration. That is, do not consider "non-manifold" volumes sharing surfaces with other volumes (non-manifold volumes can be handled by modifying surface normals and loop directions for one of the sharing volumes). Before describing the automatic sweep detect method of the invention, several geometric and topological characteristics used in the method are defined herein for purposes of the specification and claims. These characteristics either determine local (e.g., surface) meshability, or they combine local information across collections of surfaces to form meta-information about the volume being meshed. These characteristics will then be used to define the auto sweep detect method of the invention.

(Surface) Vertex Type: The classification of the topology of a vertex bounding a quadrilateral surface mesh by the number of quadrilaterals sharing the vertex. Four vertex types are used: End, Side, Corner, and Reversal. The number of quadrilaterals sharing a vertex of these types is one, two, three and four, respectively. The mesh topology represented by each vertex type is shown in FIG. 2. For convenience, an integer is assigned to each of these vertex types; this integer is used to evaluate meshability (this will be described shortly). The integers assigned to the vertex types End, Side, Corner and Reversal are +1, 0, −1, and −2, respectively.

(Volume) Edge Type: Analogous to surface vertex types, the classification of the topology of mesh edges bounding a meshed volume. Edge types End, Side, Corner and Reversal are defined as being shared by one, two, three and four 3D elements in the volume, respectively. Note that the 3D elements can be of any type (hexahedra, prisms, etc.).

Structured Mesh: In 2D, an all-quadrilateral mesh, where interior nodes (i.e., non-boundary nodes) are shared by exactly four quadrilaterals. In 3D, an all-hexahedral mesh whose bounding surface meshes are structured and whose interior nodes are shared by exactly eight hexahedra.

Mapped Mesh: In 2D, a structured mesh whose boundary consists of exactly four End-type vertices or nodes, and any remaining boundary vertices and/or nodes are of type Side, i.e., are shared by exactly two quadrilaterals.

In a 2D mapped mesh, the boundary nodes and edges between a pair of non-Side vertices make up a "side" of the map; since mapped meshes contain exactly four End vertices, they also contain exactly four sides. End vertices typically fall on geometric vertices, although this is not required. Sides are made up of one or more geometric edges, since in a BREP model edges bound faces.

Submapped Mesh: In 2D, a structured mesh whose boundary vertices and nodes are each type End, Side, Corner or Reversal.

The submapping algorithm produces structured meshes, David R. White, supra; it differs from the standard "mapping" or TFI algorithm in that it admits surfaces with more than four sides. It has been shown by David R. White that a surface can be meshed with the submapping algorithm if all its vertices can be classified with a distinct vertex type, and the sum of vertex types is four. Thus, if the vertex types bounding a surface sum to four, the surface can be submapped. Note that determination of vertex types is a geometric operation local to the surface.

In many cases, the angle used to determine vertex type is not an integer multiple of 90 degrees. Therefore, a "fuzzy" range around those integer multiples is used. If the angle is within a tolerance value (epsilon) of 90n degrees, the vertex is assigned the appropriate vertex type. The more this angle deviates from 90n degrees, the more distortion will be present at the quadrilateral(s) sharing that vertex or node. Note that the vertex type uniquely determines the topology of the mesh sharing that vertex, and therefore can be used to determine the topology of the overall mesh.

Link: A datastructure used to store sets of edges of a submapped surface according to their parameter directions.

A submappable surface can be assigned a local parameter space, with two parametric directions, referred to as i and j; each edge on the surface can be assigned to one of these directions. For each parameter, there is a set of bounding edges in each of the positive and negative parametric directions (e.g. +i and −i); the classification of edges in these sets can be inferred from the choice of a reference vertex and the vertex types by traversing around boundary loop(s) of the surface. This is depicted in FIG. 3. When an edge is assigned a parameter, that parameter varies in value along the edge, while the other parameter is constant along that edge.

Chain: Consider a traversal across a mappable surface, from one side to the opposite side. If the surface sharing the side traversed to is mappable, it too can be traversed in the same way. Traversal stops either when a non-mappable surface is encounted or when a side is encountered which has already been traversed. If all paths of the traversal end on a side that has already been traversed, the group of surfaces forms a loop of surfaces sharing edges of a given parameter; this loop is defined as a chain. In the simplest case, a chain can be a single periodic surface (see FIG. 4, Chain A) or a sequence of 4-sided mappable surfaces.

Submappable surfaces can be traversed in almost the same manner. However, because submappable surfaces can have more than four sides, the traversal path can split; for example, a traversal which begins on a −I side can traverse to two +I sides. Traversal continues in this manner until all traversal paths end, either by encountering a non-mapped and non-submapped surface, an edge that has already been traversed, or by joining with another traversal path. The group of surfaces is designated a chain if all traversal paths end on edges which have already been traversed. An example of a branched chain is shown in FIG. 4, Chain B.

Because traversal begins with edges of a given parameter, e.g. +I, and proceeds only to edges of the same parameter but opposite sign, e.g. −I, it follows that surfaces in a chain are traversed in one parameter and not the other, and one can assign a consistent parameterization across the chain such that all surfaces are traversed in the same parameter. The parameter assigned to the edges being traversed is referred to as the traversed parameter, while the other parameter is the non-traversed parameter.

Sweeping: In 2D, the generation of a 2D mesh by extruding a set of connected 1D edges into a second dimension, in single or multiple steps or layers, such that the 1D topology of each layer is identical to that of the original 1D sequence of edges. In 3D, the generation of a 3D mesh by extruding a topologically 2D mesh into a third dimension, in a single or multiple steps or layers, such that the 2D topology of each layer is identical to that of the original 2D mesh. In either case, straight-line segments join the corresponding vertices between adjacent layers.

Many-to-One Sweeping: A variant of 3D Sweeping, where instead of each layer having identical 2D topology, the topology of a given layer can be modified by adding surface elements sharing edges with the elements in the layer. The added elements are swept along with the original elements into the third dimension, so that subsequent layers have topology identical to the combination of the original and the added elements.

Many-to-Many Sweeping: Similar to Many-to-One Sweeping, except that element removal as well as addition from/to the layer of elements being swept is allowed.

2.5D Volume Mesh: A volume mesh constructed using one of the three types of sweeping defined above.

The question arises as to what makes a volume 2.5D? One needs to seek a precise definition of the geometric and topological conditions under which a volume can be meshed using Sweeping. These conditions can be deduced by observing the extrusion process.

The following discussion will start by describing the topology of a swept mesh, but eventually will describe swept mesh constraints in terms of the geometric surfaces and edges of a volume and the mesh schemes and intervals assigned to those surfaces and edges. This allows one to evaluate the constraints before generating mesh for any of the bounding curves or surfaces. Where the terms edge and surface are used without qualification or clear context, they refer to the geometric entities rather than mesh.

By definition, extruding a logically one-dimensional segmented line into a second dimension results in another line with like topology; the line being swept is referred to as the source, while the other line is called the target. This is depicted in FIG. 5, left. In three dimensions, a group of contiguous, logically two-dimensional mesh faces is swept into the third dimension, with each layer having identical mesh topology to the last and edges connecting corresponding vertices between layers; source and target surfaces are defined by the starting and ending surface(s) in the sweep. By the definition of sweeping a facetted line, as the two-dimensional facets are swept into the third dimension, the logically one-dimensional line(s) bounding them sweeps out one or more structured surface meshes (see FIG. 5, right); these surfaces are referred to as the linking surfaces.

Lemma 1: A swept mesh is bounded by one or more non-intersecting chains.

Proof: Since one starts with a set of mesh faces, their boundary is closed. By inspection, sweeping a closed boundary into a logically third dimension will generate a closed chain of surfaces. Since adding to or removing from the set of faces being swept does not change the fact that the faces have a closed boundary, Many-to-One and Many-to-Many swept meshes are also bounded by chains.

There is one situation in which chains are intersecting and a volume could be described as a swept mesh; this situation is depicted in FIG. 6. However, sweeping this volume would require extruding a mesh in some portions of the volume and re-using mesh in another part of the volume. Since this is not a true extrusion, regard this as an unsweepable volume. Indeed, none of the sweeping algorithms in Patrick M. Knupp, supra, M. L. Staten, et al., supra, or T. Blacker, supra, are capable of sweeping a volume like this.

Lemma 2: The side (linking) surfaces generated by sweeping one or more contiguous sets of mesh faces into a third dimension are mapped if the boundary of the regions being added or subtracted from the sweep do not intersect the original boundary of the sweep, or submapped if the boundaries do intersect.

Proof: Consider two cases; if the boundary of the set of faces being added or removed does not intersect the original boundary, then either one is adding a set of faces which does not intersect the original set, or one is removing a subset of faces whose boundary is formed from non-boundary edges of the original set. In both cases, one is introducing a new, closed boundary, which is then swept into a linking surface which is mapped, along with the original boundary. On the other hand, if the two boundaries do intersect, then one is modifying the boundary of the original sweep; this modifies the parameter extents on the linking surface, and by definition this generates a submapped mesh.

Using the definitions of volume edge types and Sweeping, and Lemma 2, one can also observe that:

Lemma 3: In a swept volume:

a) edges between source/target surfaces and linking surfaces are always of type End or Corner;

b) edges between source/target surfaces are always of type Side or Reversal;

c) edges between linking surfaces that are perpendicular to the sweep direction (i.e., edges that bound a single layer) are always of type Side or Reversal; and d) edges between linking surfaces that are parallel to the sweep direction (i.e., edges that bound multiple layers) can be any type.

Next, one states the following:

Lemma 4: Each set of contiguous source/target surfaces is bounded by edges having a common value of the traversed parameter with respect to the bounding linking surface(s).

Lemma 4 follows from the definitions of mapped and submapped surfaces (and their parameterizations) and Sweeping, and Lemma 2.

Lemma 5: Traversing from a set of contiguous source/target surfaces over any boundary edge of type End results in traversing a linking surface in the non-traversed parameter, no matter which End-type edge is traversed; similarly for traversing any Corner-type edge.

This Lemma follows from Lemmas 2, 3 and 4.

Lemma 6: All linking surfaces in a swept mesh can be assigned a global, consistent ij parameterization.

Proof: By consistent, one means that anywhere linking surfaces meet at a shared edge, the type (i or j) and value of ij parameter along that edge is the same. For linking surfaces which are part of the same chain, a consistent parameterization exists because the surfaces are mapped or submapped and, by the definition of a chain, every edge assigned the traversal parameter is shared by two surfaces in the chain; thus, the surfaces in the chain can be unrolled to form a contiguous submapped or mapped mesh. The parameterization of one chain extends to chains whose surfaces share non-traversed edges with surfaces in that chain. Disjoint chains have related parameterizations by virtue of Lemma 4.

Lemma 7: Traversing from the same set of contiguous source/target surface(s) onto a linking surface over an End-type versus a Corner-type edge will result in traversing the same ij parameter in opposite directions (e.g. +i and −i) on the linking surface.

Proof: Existence of a Corner-type edge implies the addition or removal of a region of faces from the source/target surface(s) being swept (by the definition of a Corner-type edge and of Sweeping). Consider the geometry in FIG. 7 (upper), with source surface $S_1$, linking surface $L_1$, and bounding edges $C_1$ and $E_1$ of type Corner and End, respectively. If $L_1$ is extended into the volume, the volume is separated into two pieces which share a surface. Traversing from $S_1$ to $L_1$ over $C_1$ is indicated by arrow a in FIG. 7 (lower), while traversing from $S_1$ to $L_1$ over $E_1$ is indicated by arrow b. However, by Lemma 5, this is equivalent to traversing along arrow c; because the interface is shared by both volumes, this in turn is equivalent to traversing along d. From here, it is clear that arrows a and d point in opposite directions along the same ij parameter of the linking surface. Using Lemmas 4 and 6, one can prove this is true even in the case where the boundary loops containing the Corner-type and End-type edges do not intersect.

Lemmas 1–7 state several characteristics of a swept mesh; to be sweepable, a volume must at least show these characteristics. This conclusion is summarized in the following theorem:

Theorem 1: A volume is sweepable only if:

a) the volume has one or more non-intersecting chains;

b) for each set of contiguous source/target surfaces, traversing over all E-type or C-type edges bounding the set results in traversing in the same global ij parameter and direction on the linking surface(s);

c) for each set of contiguous source/target surfaces bounded by both E-type and C-type edges, traversing over any E-type edge bounding the set results in traversing in the same global ij parameter and opposite direction on the linking surface as resulting from traversing over any C-type edge bounding the set.

Proof: a) was proven by Lemma 1; b) and c) were proven by Lemma 7.

Although the conditions in Theorem 1 are necessary for sweepability, these conditions are not sufficient, even if we place no constraints on the quality of the resulting mesh. For example, consider a volume containing a through-hole, one which ties itself in a knot without its surfaces intersecting.

This volume is clearly not sweepable, but still passes the constraints in Theorem 1. There is likely an additional constraint that can be placed on the bounding surface mesh which would capture examples like this; this constraint is likely similar to those discussed in Scott A. Mitchell, "A Characterization of the Quadrilateral Meshes of a Surface Which Admit a Compatible Hexahedral Mesh of the Enclosed Volume", Proceedings of the 13th Annual Symposium on Theoretical Aspects of Computer Science, Springer, pp. 465–476 (1996). However, such an example is not expected in practical applications.

Although it has been proven that Theorem 1 is a necessary condition for sweepability, looking at an example will show why Theorem 1b and 1c in particular are needed. Consider the volume in FIG. 8. If the edges $E_1$ and $E_2$ are designated as type End, the surfaces $L_1$ and $L_2$ each form a chain, these chains are non-intersecting, and passes Theorem 1a. However, traversing from $S_1$ to $L_1$ and $L_2$ over $E_1$ and $E_2$, respectively, results in traversing the linking surfaces in opposite directions in the same ij parameter; this violates Theorem 1b. On the other hand, if edge $E_1$ is designated type Corner, then according to Theorem 1b and 1c the volume is sweepable. In fact, the volume can be meshed by sweeping $S_2$ down to to $E_1$, then adding surface $S_1$ and sweeping down to $S_3$.

When the type of edge $E_1$ in FIG. 8 is set to Corner, the volume becomes sweepable. However, because edge $E_2$ is type end, quadrilateral pairs sharing edges on $E_2$ will be part of the same hex; the dihedral angle between these faces will be 180 degrees. For most applications, hexes with interior angles of 180 degrees are of insufficient quality. Therefore, even though volumes meeting the conditions in Theorem 1 are sweepable, the resulting meshes may not be of sufficient quality for analysis. Additional constraints are needed to improve mesh quality.

The combination of volume edge types and source/target surfaces uniquely determine the topology of the mesh at all geometric edges. This topology was described in the definition of the different volume edge types, and constraints on allowable volume edge types were described in Lemma 2. For the purposes of mesh quality, one must place constraints on the dihedral angles between surfaces meeting at various edge types; these constraints are similar to those used in the submapping algorithm of David R. White, supra.

Assuming that an ideal hex element is one whose angles are all 90 degrees, each of the vertex types in FIG. 2 (and the corresponding volume edge types) has a corresponding ideal angle; these angles are 90, 180, 270 and 360 degrees for End, Side, Corner and Reversal types, respectively. Around these ranges are "fuzzy" regions, approximately 45 degrees on either side of the ideal, within which hex quality is degraded but not inadequate. Most finite element applications require that face angles be bounded between zero and 180 degrees. These angle constraints impose limits on angles at the given edge types. The angle at End-type edges is limited to 180 degrees; Side-type edges are limited to 360 degrees. Corner and Reversal type edges are limited to 360 degrees, not to prevent hex angles greater than 180 degrees but to prevent overlapping elements. These element constraints are summarized in the following Theorem:

Theorem 2: To ensure element angles less than 180 degrees and non-overlapping elements, End-type edges must be less than 180 degrees, and Side, Corner and Reversal edges must be less than 360 degrees. All angles must be greater than zero degrees.

Finally, the available sweep algorithm may determine additional constraints on the topology of surfaces in S or L. The "standard" sweep algorithm allows the extrusion of one surface (the "source" surface) onto a single "target" surface of identical topology; this is often referred to as a one-to-one sweep. M. L. Staten, et al., supra; Amy P. Gilkey, et al., "GEN3D: A GENESIS Database 2D to 3D Transformation Program", SAND89-0485, Sandia National Laboratories, Albuquerque, N. Mex. (February 1994). There also exist other varieties of sweeping which have fewer constraints on source and target topology, e.g., "many-to-one" or n->1 sweeps, Lai Mingwu, et al., "A Multiple Source and Target Sweeping Method for Generating All-Hexahedral Finite Element Meshes", Proc. 5th Int. Meshing Roundtable, SAND96-2301, Sandia National Laboratories, Albuquerque, N. Mex. (September 1996), and "many-to-many" or n->m sweeps, T. Blacker, supra; Lai Mingwu, et al., "Automated Hexahedral Mesh Generation by Geneeralized Multiple Source to Multiple Target Sweeping", 2nd Symposium on Trends in Unstructured Mesh Generation, Boulder, Colo. (August 1999). Many-to-many sweeps may require modifications to the topology of source or target surfaces, depending on implementation. This is summarized in the following Lemma:

Lemma 3: Volumes in which source/target surfaces share an edge of type Reversal require muliple source and target sweeping; volumes in which source/target and linking surfaces share edges of type Corner require multiple source/ single target or multiple source/target sweeping; volumes in which linking surfaces share edges perpendicular to the sweep direction of type Reversal require multiple source/ single target sweeping; and volumes containing multiple source/target surfaces require multiple source and possibly multiple target sweeping.

Some algorithms may also impose topological restrictions on linking surfaces; for example, some implementations require the linking surfaces to all be mappable (having only 4 sides), while others allow more general submappable surfaces with imprints which form interior holes. These additional constraints can be evaluated after the determination of whether a volume is sweepable. These considerations lead to a fourth type of sweepability criterion:

Lemma 4: Sweepable volumes contain constraints on the topology of linking surfaces; these constraints depend on the Sweeping implementation being used.

Fuzzy regions around the ideal angles for the four vertex and edge types allow the use of submapping and mapping schemes on surfaces, and sweeping on volumes, where they might not typically be used. For example, the surface mesh shown in FIG. 9 was obtained by setting vertex 4 to type End, even though by angle measurement it was closer to type Side. Although this degraded mesh quality locally, it allowed the volume to be swept, and the resulting mesh had an acceptable overall mesh quality.

For application to mesh generation, the definition of a sweepable volume is less constrained geometrically, since it is not strictly required that the cross section of the extrusion have a constant area or even that its normal maintain a constant direction. This makes the detection of mesh-sweepable volumes considerably more efficient, since there is no need to evaluate global geometric constraints. At the same time, an extruded volume in the mesh generation application is more constrained in terms of topology, as represented by Theorems 1 and 3 above. There are also local geometric constraints, represented by Theorem 2. However, topological and local geometric constraints are easier and faster to evaluate than the global geometric constraints used in the past.

Theorem 1 identified the conditions necessary for a volume to be sweepable. Next is described the method of the invention used to verify that the conditions in Theorem 1 are met by a given volume. The auto sweep detection algorithm comprises the following five steps:

1) Classify surface mesh schemes locally using surface vertex types.

Automatic surface mesh scheme assignment is accomplished by first computing surface vertex types for all vertices on a surface, then summing the angles at the vertices (assigning the numbers 1, 0, −1 and −2 to end, side, corner, and reversal vertex types, respectively). If this sum is equal to four, the surface is submappable. David R. White, supra. Note that the criteria used to assign vertex types for automatic surface mesh scheme assignment are somewhat more conservative than those used to find the "corners" in the submap algorithm when the user assigns that scheme explicitly. More conservative vertex type criteria lead to fewer surfaces that are assigned a submap scheme; the surfaces not assigned submap are usually assigned the paving scheme. Roger J. Cass, et al., "Generalized 3-D Paving: An Automated Quadrilateral Surface Mesh Generation Algorithm", Int. J. Numer. Meth. Eng. 39:1475–1489 (1996).

2) Group mappable and submappable surfaces into chains.

Once the corners have been chosen, mapped and submapped surfaces have an implied, logical 2D parameter space defined. This parameter space is implied even before meshing occurs, since the corners define the structure of the mesh if not the actual mesh. This parameterization can be used to traverse from a given edge across the surface to the "opposite" edge (see FIG. 3). This traversal can continue across the surface sharing the second edge, and so on until either it meets up with the original edge again or it encounters a surface that is not assigned the map or submap mesh scheme. If a complete loop of surfaces results, this group of surfaces define a chain.

If a submapped surface is encountered during a traversal, the loop may branch into more than one section; this branching is analogous to a parallel circuit. For example, FIG. 3 shows one such chain, part of which branches into two parallel sections (parallel in a topological sense, not a geometric sense).

The result of looping the surfaces is a number of chains. If the number of chains is zero, there are no complete loops of mappable/submappable surfaces, therefore, by Theorem 1, the volume is not sweepable. If on the other hand all the bounding surfaces of a volume are mappable or submappable, then the volume itself is submappable. Finally, there are many cases where a submappable surface is part of two chains, but the volume is not submappable. In these cases, one or more source/target surfaces will be mappable or submappable.

3) Compute volume edge types.

The computation of volume edge types is not done until looping the surfaces bounding the volume has been done; the cost of this step is saved in the cases where the volume is either submappable or when no chains are found. Note that computing volume edge types is an operation local to the edge and the two surfaces connected to it.

4) Traverse surfaces, grouping them in S and L.

In addition to determining whether a volume is sweepable, it must be determined which are the source and target surfaces for the sweep. This is done by traversing the surfaces; pseudo code for this traversal process is shown in Table 1.

TABLE 1

Pseudo code for traversing source/target surfaces.

find a non-submapped surface r; insert r in source/target list S; call prop_to_next_src_tgt(r, S)
Procedure prop_to_next_src_tgt(Surface r, Src/Tgt List q):
    for each edge e in surface r:
        find other surface sharing that edge, s
        if s is already in S, T or L, continue to next edge
        else if edge e is an end or corner, call link_to_next_src_tgt(r,e,q)
        else if e is side:
            if e is a side type, choose p = q
            else if e is a reversal type, choose p = opposite(q)
            call prop_to_next_src_tgt(r, p)
Procedure link_to_next_src_tgt(Surface r, Edge e, Src/Tgt List q):
    if r is neither mapped nor submapped, or has no valid chains, return NOT_SWEEPABLE
    put r in linking surface list L
    for each edge f of surface r:
        if edge f has ij parameter different from that of e, continue at next edge
        get other surface s sharing edge f
        if s is already in S, T or L, continue at next edge
        else if edge f has type side, call link_to_next_src_tgt(s, f, q)
        else:
            set type of next source/target surface s by calling p=next_type(e, f, q)
            call prop_to_next_src_tgt(s, p)
Procedure next_type(Edge e, Edge f, Src/Tgt List p)
    If e and f are different type (End-Corner or Corner-End), return p
    Else if e and f are same type (End-End or Corner-Corner), return opposite(p), where
        opposite(SRC_LIST) = TGT_LIST, etc.

There are several things to note in the pseudo code shown in Table 1. First, the traversal of source/target and linking surfaces is recursive, and ends when either all the surfaces have been put into one of the lists (S, T or L), or a surface is encountered which should be a linking surface (i.e., submappable and part of a valid chain) but which is not.

The result of this traversal will be a determination of whether or not the volume is sweepable, and if so, what the source and target surfaces are. This latter information is useful for evaluating criteria in Theorems 1b, 1c and 2–4. The assignment of source and target lists is arbitrary; that is, these lists can be interchanged. This can be useful when the target surface(s) are meshed or when there are multiple targets and a single source (switching the lists in this case simplifies the sweep).

5) Check for satisfying Theorem 1b–c, i.e., that traversing from source/target surface(s) onto adjacent linking surface(s) in two places traverses in same and opposite directions when traversing over the same edge type (end/end or corner/corner) or a different edge type (end/corner), respectively.

After assigning volume sweep schemes, these volumes can be meshed individually. However, in many applications, the volumes are part of a larger assembly, where the volumes share surfaces and their corresponding mesh. In this case, there are additional constraints on the order of meshing volumes that must be met to avoid further complications in sweeping the volumes.

For example, consider the four volumes in FIG. 10. If these volumes are meshed in an arbitrary order, for example volumes 1, 2, 4 then 3, then the last volume will already have mesh on all its source and target surfaces specified. Changing the mesh on these surfaces is not possible without changing the adjoining volume meshes, which can be difficult. Therefore, meshing volume 3 will be difficult because the source and target meshes will have to coincide. By Lemma 1'a, the number of faces on the source and target surfaces must be the same; if they are not, the volume will not be sweepable.

The volumes in FIG. 10 can be meshed in an order that avoids any of the above difficulties; for this example, the order is volume 3, 4, 2 then 1. In fact, one can build this order automatically by traversing the connected volumes over their source and target surface lists. The method of the invention for this traversal, referred to as "automatic sweep grouping", is shown in Table 2.

TABLE 2

Pseudo code for building sweep dependencies.

Collect all sweepable volumes and unmark them
Collect all sweepable "end" volumes (volumes with source/target surface not shared by another sweepable volume)
For each end volume v:
    If v is marked, continue to next volume
    Mark v
    Call prop_from_source(v, source_volume_list)
    Call prop_from_target(v, target_volume_list)
    Sweep_group = source_volume_list + v + target_volume_list
If any unmarked sweepable volumes, resolve cyclic sweep groups
Procedure prop_from_source(volume v, volume list source_vol_list)
    Get source face list for v
    For each source face f:
        a = adjacent volume from v across f
        If a is NULL, continue to next face
        Else if a is not assigned sweep scheme, continue
        Else if a is marked, continue
        Else
            Mark a
            Call prop_from_source(a, source_vol_list)
            Insert a in source_vol_list
            If f is a source face for a:
                Call prop_from_target(a, source_vol_list)
Procedure prop_from_target(volume v, volume list target_vol_list)
    Get target list for v
    For each target face f:
        a = adjacent volume from v across f
        If a is NULL, continue
        Else if a is not assigned sweep scheme, continue TABLE 2-continued Pseudo code for building sweep dependencies.

Else if a is marked, continue
        Else
            Mark a
            Call prop_from_source(a, target_vol_list)
            Insert a in target_vol_list
            Call prop_from_target(a, target_vol_list)

Automatic sweep grouping is useful primarily for resolving dependencies in sweep order when sweeping assemblies of volumes. However, it is also useful for separating a large collection of volumes into independent groups, each of which can be meshed independently of the others. This facilitates the meshing of large assemblies by teams of users, and has significantly reduced the wall clock time for hex meshing these assemblies.

There are many uses for the automatic sweep detection method of the present invention. First and foremost, the method is useful for automating the specification of source and target surfaces for volumes that the user knows are sweepable. For example, the geometry shown in FIG. 11 consists of 33 sweepable volumes; auto sweep detect determines that these volumes are sweepable, and sets the source and target surfaces for each automatically. Note that in this example, the block contains both blind holes and through-holes. More examples of sweepable volumes detected by the present invention are shown in FIGS. 12–14.

Another application of auto sweep detect is to filter a large group of volumes into sweepable and non-sweepable ones; this allows the user to quickly determine which volumes are not meshable and need to be decomposed further (in the case where a 3D auto hex algorithm is not available). For example, in an experiment on a large meshing application at Sandia National Laboratories, the method of the invention identified 220 of 245 volumes as being sweepable, leaving only 10% of the volumes for further inspection and decomposition. Thus, this algorithm can be used to quickly reduce the number of volumes needing further interactive decomposition.

The identification of chains of surfaces emerging in the sweeping process has also been used to identify independent sweep paths, which in turn is used to determine mesh interval constraints which guarantee that the resulting volume can be meshed. J. Shepherd, et al., "Interval Assignment for Volumes with Holes", 2nd Symposium on Trends in Unstructured Mesh Generation, Boulder, Colo. (August 1999). This is useful when sweeping volumes containing through-holes, for example.

The present invention is also useful for guiding an automatic geometry decomposition tool that is being developed, such as one discussed in Y. Lu, et al., "Feature Decomposition for Hexahedral Meshing", 1999 ASME Design Automation Conference, Las Vegas, Nev. (September 1999). Auto sweep detect can provide a stopping criterion for the decomposition tool, terminating decomposition when all the pieces are sweepable. Chains of surfaces bounding volumes which are not sweepable may also be useful for guiding further decomposition.

To summarize, the present invention provides a method for determining whether or not a volume is sweepable, and if so, identifying the source and target surfaces. This method relies on local geometry in the form of vertex and edge types, as well as on surface topology. Because only local geometric information is used, the method is quite efficient and reliable.

Finally, it has been shown that there are also sweep order dependencies which must be met to guarantee meshing of assemblies of volumes; in some cases, not satisfying these dependencies can result in some of the volumes not being sweepable. A method which computes these dependencies has also been given; this method relies only on topology information for swept volumes, and is therefore quite efficient.

The auto sweep detect method has been used to reduce interactive user time required to generate all-hexahedral meshes by filtering out non-sweepable volumes needing further decomposition. The method can be used to identify independent sweep paths, for use in volume-based interval assignment. The automatic sweep grouping method is also been useful for resolving sweep dependencies, and therefore reducing interactive time meshing large assemblies. It is also useful for splitting large meshing jobs into independent pieces which can be meshed concurrently by multiple users.

The auto sweep detect algorithm is also useful for guiding automatic geometry decomposition, both by providing a stopping criterion for such a tool, and for guiding further decomposition using completed chains on unsweepable volumes.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method of automatically determining whether a mesh can be generated by sweeping for a representation of a geometric solid, the method comprising the steps of:
   classifying surface mesh schemes for surfaces of the representation locally using surface vertex types;
   grouping mappable and submappable surfaces of the representation into chains;
   computing volume edge types for the representation;
   recursively traversing surfaces of the representation and grouping the surfaces into source, target, and linking surface lists; and
   checking traversal direction when traversing onto linking surfaces.

2. The method of claim 1 additionally comprising the step of determining that no mesh can be generated if a number of chains established in the grouping step is zero.

3. The method of claim 1 additionally comprising the step of determining that chains contain a consistent ij parameterization.

4. The method of claim 1 additionally comprising the step of determining that all source/target surfaces sharing edges have a same non-traversed parameter with respect to linking surfaces bounding them.

5. The method of claim 1 additionally comprising the step of determining that all linking surfaces have a globally consistent ij parameterization.

6. The method of claim 5 additionally comprising the step of determining that traversing from a source/target surface over any two edges of a same edge type onto one or more linking surface results in traversing a non-traversed parameter in a same direction.

7. The method of claim 5 additionally comprising the step of determining that traversing from a source/target surface over any two edges of a different edge type onto one or more linking surfaces results in traversing a non-traversed parameter in an opposite direction.

8. The method of claim 1 wherein in the computing step the volume edge types comprise end, side, corner, and reversal.

9. The method of claim 1 wherein in the computing step the volume edge types are not computed until it is verified that chains are complete.

10. The method of claim 1 additionally comprising the step of determining that no mesh can be generated if in the traversing step a surface is encountered which should be submappable and part of a chain but is not.

11. A method of automatically determining an order in which to mesh surfaces of a meshable representation of a geometric solid, the method comprising the steps of:
    performing the steps of claim 1; and
    recursively traversing the source and target lists.

12. Computer software for automatically determining whether a mesh can be generated by sweeping for a representation of a geometric solid, said software comprising:
    means for classifying surface mesh schemes for surfaces of the representation locally using surface vertex types;
    means for grouping mappable and submappable surfaces of the representation into chains;
    means for computing volume edge types for the representation;
    means for recursively traversing surfaces of the representation and grouping the surfaces into source, target, and linking surface lists; and
    means for checking traversal direction when traversing onto linking surfaces.

13. The software of claim 12 additionally comprising means for determining that no mesh can be generated if a number of chains established by said grouping means is zero.

14. The software of claim 12 additionally comprising means for determining that chains contain a consistent ij parameterization.

15. The software of claim 12 additionally comprising means for determining that all source/target surfaces sharing edges have a same non-traversed parameter with respect to linking surfaces bounding them.

16. The software of claim 12 additionally comprising means for determining that all linking surfaces have a globally consistent ij parameterization.

17. The software of claim 16 additionally comprising means for determining that traversing from a source/target surface over any two edges of a same edge type onto one or more linking surface results in traversing a non-traversed parameter in a same direction.

18. The software of claim 16 additionally comprising means for determining that traversing from a source/target surface over any two edges of a different edge type onto one or more linking surfaces results in traversing a non-traversed parameter in an opposite direction.

19. The software of claim 12 wherein in said computing means the volume edge types comprise end, side, corner, and reversal.

20. The software of claim 12 wherein in said computing means the volume edge types are not computed until it is verified that chains are complete.

21. The software of claim 12 additionally comprising means for determining that no mesh can be generated if said traversing means encounters a surface that should be sub-mappable and part of a chain but is not.

22. Computer software for automatically determining an order in which to mesh surfaces of a meshable representation of a geometric solid, said software comprising:
   software of claim 12; and
   means for recursively traversing the source and target lists.

* * * * *